United States Patent
Verdeflor et al.

(10) Patent No.: US 6,319,418 B1
(45) Date of Patent: Nov. 20, 2001

(54) ZIG-ZAGGED PLATING BUS LINES

(75) Inventors: Arvin Verdeflor; Albert Loh; Steven Liew; William S. Villaviray, all of Singapore (SG)

(73) Assignee: St. Assembly Test Services Pte Ltd., Singapore (SG)

( * ) Notice: Subject to any disclaimer, the term of this patent is extended or adjusted under 35 U.S.C. 154(b) by 0 days.

(21) Appl. No.: 09/467,119

(22) Filed: Dec. 20, 1999

(51) Int. Cl.[7] ...................................... B44C 1/22
(52) U.S. Cl. ........................... 216/13; 216/20; 216/33
(58) Field of Search ........................... 216/13, 15, 18, 216/20, 33

(56) References Cited

U.S. PATENT DOCUMENTS

| | | | |
|---|---|---|---|
| 5,300,168 | * 4/1994 | Nakao et al. | 216/13 X |
| 5,483,102 | 1/1996 | Neal et al. | 257/712 |
| 5,703,402 | 12/1997 | Chu et al. | 257/737 |
| 5,777,381 | 7/1998 | Nishida | 257/693 |

* cited by examiner

Primary Examiner—William A. Powell
(74) Attorney, Agent, or Firm—George O. Saile; Stephen B. Ackerman

(57) ABSTRACT

A new pattern is provided for the bus lines that are used to facilitate plating of layers of electrical lines that form a Printed Circuit Board. Where Prior Art bus lines have a straight-line geometry, the bus lines of the invention have any geometry that is not a straight-line geometry. The geometry of the bus lines of the invention can be of any design as long as this design allows for interrupted cutting of the bus line, that is the cutting tool does not, during the process of cutting the bus line, make constant and continuous contact with the bus line.

9 Claims, 1 Drawing Sheet

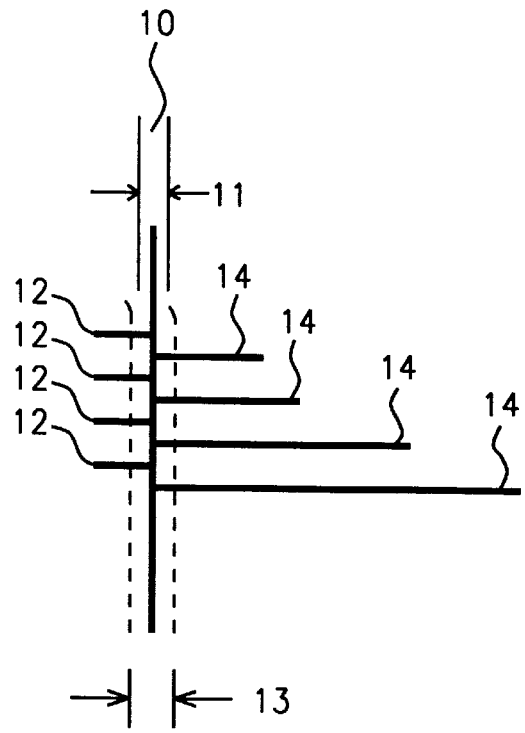
FIG. 1 - Prior Art
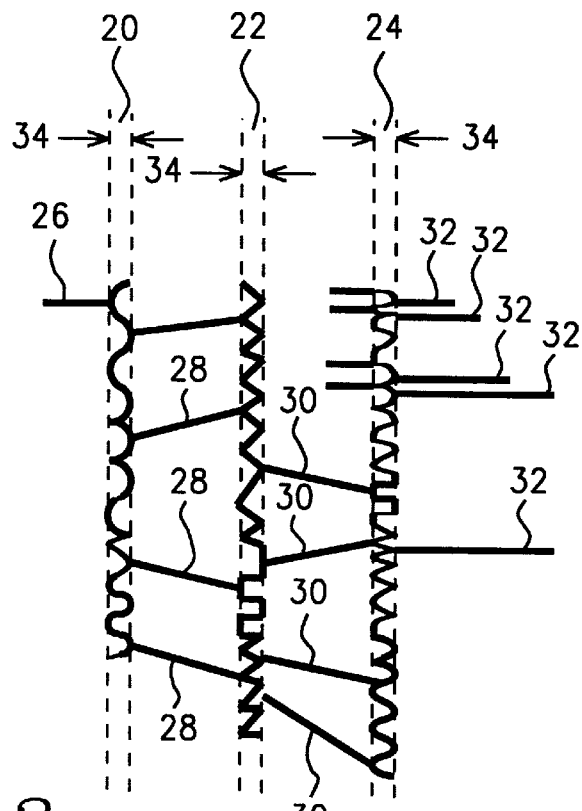
FIG. 2

ZIG-ZAGGED PLATING BUS LINES

BACKGROUND OF THE INVENTION

(1) Field of the Invention

The invention relates to the fabrication of Printed Circuit Boards (PCB's) that are used with integrated circuit devices, and more particularly, to a method of creating and applying a non-linear plating bus geometry for the manufacturing of Printed Circuit Boards.

(2) Description of the Prior Art

Printed Circuit Boards (PCB's) are being used extensively in the creation of large semiconductor functional units. The PCB serves a number of different functions when used to mount semiconductor devices such as providing mechanical or structural support for the semiconductor devices, the ability to significantly increase the number of Input/Output (I/O) terminals and the ability to reduce thermal constraints that otherwise would be imposed on the semiconductor device. To enable the mounting of semiconductor devices on the surface of a PCB, different device packages have been developed. Among these different packages, the Quad Flat Package (QFP) and the Ball Grid Array (BGA) package are frequently used.

Quad Flat Packages (QFP) have in the past been used to create surface mounted high pin count integrated packages with various pin configurations. The electrical connections with these packages are typically established by closely spaced leads that are distributed along the four edges of the flat package. This limits the usefulness of the QFP since a high Input/Output (I/O) count cannot be accommodated in this manner. To address this problem, the Ball Grid Array (BGA) package has been created whereby the I/O points for the package are distributed not only around the periphery of the package but over the complete bottom of the package. The BGA package can therefore support more I/O points making this a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mil spacings in a regular or staggered pattern.

In PCB manufacturing, multiple layers of printed circuits are created inside the printed circuit board. These layers are superimposed and are electrically isolated from each other. The printed circuits that make up the various layers of the PCB establish the electrical interconnections between the semiconductor devices and the surrounding circuitry. To facilitate the plating of printed circuits inside the PCB, plating bus lines are typically used. At the start of the PCB assembly process, the plating bus lines electrically short the whole PCB strip. During the process of separation or singulation of these matrix BGA's, these bus lines are mechanically removed by sawing through the bus lines. In this manner, the traces of the singulated units are electrically isolated. Current practice and present industry standards use bus lines that are straight lines. The indicated process of singulation using the straight bus lines results in the occurrence of copper particles or slivers during the sawing of these lines. These copper particles cause the singulated lines to be electrically shorted. Also, the straight bus lines that are currently used frequently cause electrical shorting of the semiconductor device due to uncut bus lines as a result of a slight shift in the (linear trajectory of the) cutting of the bus line. The invention provides a method that eliminates these problems and that therefore results in a significant improvement in the yield of manufacturing Printed Circuit Boards.

FIG. 1 shows a top view of a Prior Art process of cutting a bus line. The lines 12 and 14 form the printed circuit interconnect lines that form a layer within the PCB board. The bus line 10 is the (extraneous) line that is used to facilitate the plating of the printed circuit board. This line 10 is about 0.15 mm wide (11) and is to be removed by sawing; the width 13 of the cut of the sawing is about 0.25 mm. This process of removal results in the above indicated problems of electrical shorts between individual printed circuit lines 12 and/or 14 while it is clear that, if the singulation cut is not straight, parts of the bus line 10 will not be removed resulting in electrical shorts of devices that are to be mounted on the PCB.

SUMMARY OF THE INVENTION

A principle objective of the invention to provide bus line patterns that are used in the creation of Printed Circuit Boards that allow for the removal of the bus lines without creating extraneous particles of the removed bus lines and that therefore does not have a negative effect on PCB production yield.

In accordance with the objectives of the invention a new pattern is provided for the bus lines that are used to facilitate plating of layers of electrical lines that form a Printed Circuit Board. Where Prior Art bus lines have a straight-line geometry, the bus lines of the invention have any geometry that is not a straight-line. The geometry of the bus lines of the invention can be of any design as long as this design allows for interrupted cutting of the bus line, that is the cutting tool does not, during the process of cutting the bus line, make constant and continuous contact with the bus line.

U.S. Pat. No. 5,703,402(Chu et al. shows a BGA with buses or traces.

U.S. Pat. No. 5,777,381(Nishida) shows a packaging with bus lines.

U.S. Pat. No. 5,483,102(Neal et al.) shows a conventional package, such as a BGA, having bus lines.

BRIEF DESCRIPTION OF THE DRAWINGS

FIG. 1 shows a top view of Prior Art metal interconnect traces and a bus line.

FIG. 2 shows a top view of a layer inside a PCB with a number of examples of bus line designs.

DESCRIPTION OF THE PREFERRED EMBODIMENTS

Referring now specifically to FIG. 2, there is shown a top view of a layer of metal interconnect lines on a surface inside a PCB with a number of examples of bus line designs. Shown in FIG. 2 are examples of metal lines or traces (metal interconnect lines) 26, 28, 30 and 32. These metal traces are shown as examples and can be of any layout and design. It is clear that the number of these traces and the direction in which these traces intersect with the bus lines are not relevant to the subject under discussion. The bus lines that are indicated in FIG. 2 are highlighted as lines 20, 22 and 24. It is again clear that the number of bus lines that form part of the metal interconnect layer in the PCB and the angle under which these bus lines intersect with the metal traces is not of significance to the subject under discussion. It is however also clear that the pattern or geometry of the bus lines 20, 22 and 24 is completely arbitrary as long as this pattern is not a straight line. By not being a straight line, the bus lines 20, 22 and 24 can be cut such that the cutting is not a continuous process. That is the cutting tool is not continuously in contact with the bus line while the bus line is being cut thus preventing the formation of metal particles (formed by the removal of copper from the bus line) that remain attached to the metal traces 26, 28, 30 and 32 after the bus line has been cut. Also, slight deviation in the cutting of the bus line does not result in an extended portion of the bus line remaining in place. Since the geometry of the bus line is not a straight line, slight deviations in the linearity of the cutting trajectory still removes the bus material between adjacent areas of the bus line thereby interrupting the continuity of the bus line and preventing electrical shorts between I/O points of the device that is mounted on the surface of the PCB. The cross section of the bus line that can be used to facilitate the plating of the printed circuits is typically about 0.09 mm wide, the dimension 34 within which the geometry of the bus line is contained can typically be slightly larger than about 0.25 mm, the width of the cut that is applied to removed the bus line is typically about 0.25 mm. The distance between the adjacent bus lines 20, 22 and 24 (not highlighted) is not affected by the design of the bus lines of the invention and is determined by the requirements of plating of the printed circuit interconnect lines inside the PCB.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating interconnect wires in successive layers of Printed Circuit Boards, comprising the steps of:

providing a first layer of a partially completed PCB circuit board;

depositing a first layer of metal over the surface of said first layer of said partially completed PCB;

patterning and etching said first layer of metal thereby forming a first interconnect pattern of said PCB;

plating said first interconnect pattern thereby creating the first interconnect layer of metal of said PCB whereby hereafter said first interconnect layer is referred to as the preceding interconnect layer;

providing a following layer of a partially completed PCB circuit board whereby said following layer of partially completed PCB board follows said preceding interconnect layer in the sequence of the creation of said PCB;

depositing a following layer of metal over the surface of said following layer of said partially completed PCB;

patterning and etching said following layer of metal thereby forming a following interconnect pattern on the surface of said following layer of said PCB;

plating said following interconnect pattern on the surface of said following interconnect layer thereby creating a following interconnect layer of metal on the surface of said following layer of said PCB;

repeating the process of creating additional layers of said partially completed PCB by repeating the above processing steps starting with said step of providing a following layer of a partially completed PCB circuit board and ending with said step of plating said interconnect pattern on the surface of said following layer said repetition to occur a number of times that equals the required layers to be contained within said PCB minus one thereby completing the creation of said PCB; and separating said completed PCB into individual PCB units.

2. The method of claim 1 wherein said first layer of a partially completed PCB circuit board contains ceramic or plastic or epoxy or epoxy compound that is applied in the art for the creation of Printed Circuit Boards.

3. The method of claim 1 wherein said first layer of metal contains copper that is applied in the art for the creation of interconnect layers of metal of Printed Circuit Boards.

4. The method of claim 1 wherein said first interconnect pattern contains a plurality of metal interconnect lines in addition to a plurality of metal bus lines.

5. The method of claim 4, said metal bus lines having a design, the design of said bus lines being created by following but never coinciding over an extended distance with a central axis, said central axis of said metal bus lines being a straight line, the design of said bus lines furthermore being contained in a surface area extending about 0.125 mm on both sides of said central axis.

6. The method of claim 1 wherein said following layer of a partially completed PCB circuit board contains plastic that is applied in the art for the construction of Printed Circuit Boards.

7. The method of claim 1 wherein said following layer of metal over the surface of said following layer of said partially completed PCB contains copper that is applied in the art for the construction of interconnect layers of metal of Printed Circuit Boards.

8. The method of claim 1 wherein said following interconnect pattern contains a plurality of metal interconnect lines in addition to a plurality of metal bus lines.

9. The method of claim 8, said metal bus lines having a design, the design of said bus lines being created by following but never coinciding over an extended distance with a central axis, said central axis of said metal bus lines being a straight line, the design of said bus lines furthermore being contained in a surface area extending about 0.125 mm on both sides of said central axis.

* * * * *